(12) United States Patent
Kunkel et al.

(10) Patent No.: US 8,362,537 B2
(45) Date of Patent: Jan. 29, 2013

(54) MEMORY DEVICES INCLUDING SEMICONDUCTOR PILLARS

(75) Inventors: Gerhard Kunkel, Radebeul (DE); Peter Baars, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 13/360,965

(22) Filed: Jan. 30, 2012

(65) Prior Publication Data

US 2012/0126301 A1    May 24, 2012

Related U.S. Application Data

(62) Division of application No. 12/249,225, filed on Oct. 10, 2008, now abandoned.

(51) Int. Cl.
*H01L 27/108* (2006.01)

(52) U.S. Cl. .............. 257/296; 257/302; 257/E27.084

(58) Field of Classification Search ........... 257/296, 257/302, 306, E27.084, E27.088, E27.091
See application file for complete search history.

(56) References Cited

U.S. PATENT DOCUMENTS

| | | | |
|---|---|---|---|
| 5,497,017 A | 3/1996 | Gonzales | |
| 5,710,072 A | 1/1998 | Krautschneider et al. | |
| 6,034,389 A | 3/2000 | Burns, Jr. et al. | |
| 6,104,061 A | 8/2000 | Forbes et al. | |
| 6,504,201 B1 | 1/2003 | Noble et al. | |
| 6,750,095 B1 | 6/2004 | Bertagnoll et al. | |
| 7,109,544 B2 | 9/2006 | Schloesser et al. | |
| 2004/0188726 A1 | 9/2004 | Iriyama et al. | |
| 2004/0235243 A1 | 11/2004 | Noble et al. | |
| 2006/0017088 A1 | 1/2006 | Abbott et al. | |
| 2006/0043450 A1 | 3/2006 | Tang et al. | |
| 2006/0113587 A1 | 6/2006 | Thies et al. | |
| 2006/0170031 A1 | 8/2006 | Kang et al. | |
| 2008/0105933 A1 | 5/2008 | Yu et al. | |
| 2010/0090263 A1 | 4/2010 | Kunkel et al. | |
| 2010/0090264 A1 | 4/2010 | Moll et al. | |

OTHER PUBLICATIONS

Non-Final Office Action dated Dec. 14, 2010, for U.S. Appl. No. 12/249,060. 21 Pages.
Final Office Action dated Jun. 17, 2011, for U.S. Appl. No. 12/249,060. 37 Pages.
Notice of Allowance dated Nov. 14, 2011 for U.S. Appl. No. 12/249,060. 23 Pages.
Non-Final Office Action dated Sep. 9, 2010, for U.S. Appl. No. 12/249,225. 25 Pages.
Final Office Action dated Mar. 9, 2011, for U.S. Appl. No. 12/249,225. 30 Pages.
Non-Final Office Action dated Jul. 1, 2011, for U.S. Appl. No. 12/249,225. 23 Pages.

*Primary Examiner* — Jerome Jackson, Jr.
*Assistant Examiner* — Yu Chen
(74) *Attorney, Agent, or Firm* — Eschweiler & Associates, LLC

(57) ABSTRACT

One embodiment relates to an integrated circuit that includes a memory array of pillars arranged in rows and columns. The pillars are separated from one another by row trenches and column trenches. The column trenches include a pair of parallel column trenches. A first trench of the pair includes two parallel bit lines coupled to pillars adjacent to the first trench. A second trench of the pair is free of bit lines. Other methods, devices, and systems are also disclosed.

12 Claims, 17 Drawing Sheets

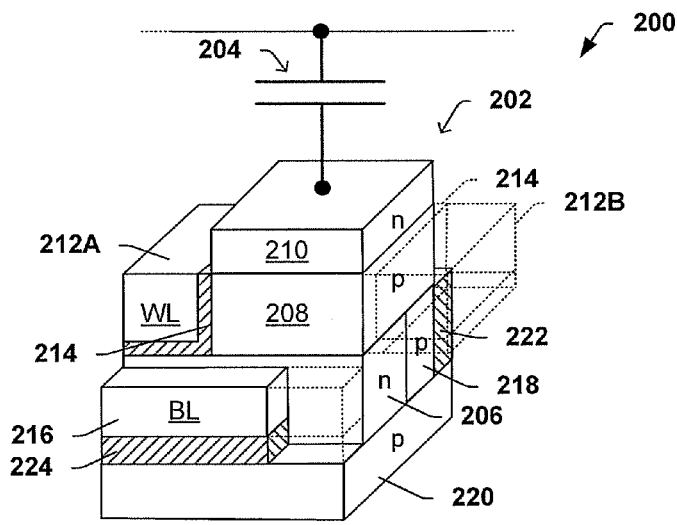
Fig. 2
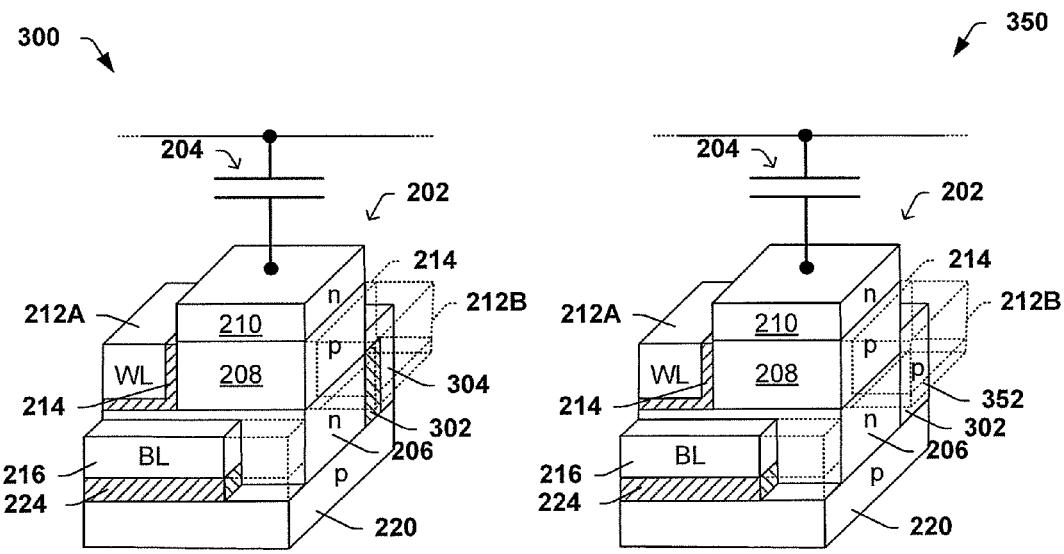
Fig. 3  Fig. 4

US 8,362,537 B2

MEMORY DEVICES INCLUDING SEMICONDUCTOR PILLARS

REFERENCE TO RELATED APPLICATION

This application is a divisional of U.S. patent application Ser. No. 12/249,225 filed on Oct. 10, 2008.

FIELD

The present disclosure relates generally to semiconductor devices, and more particularly to improved methods and systems for semiconductor memories.

BACKGROUND

Several trends presently exist in the semiconductor and electronics industry. One trend is that recent generations of portable electronic devices are using more memory than previous generations. This increase in memory allows these new devices to store more data, such as music or images, and also may provide the devices with more computational power and speed.

One type of memory device includes an array of memory cells, where each memory cell includes a storage capacitor. Depending on the amount of charge stored in the capacitor, the capacitor can be switched between two or more states (e.g., a high-charge state and a low-charge state). In real world-implementations, the high-charge state can be associated with a logical "1" and the low-charge state can be associated with a logical "0", or vice versa. Additional charge states could also be defined to implement a multi-bit cell with more than two states per cell. Therefore, by switching between these states, a user can store any combination of "1"s and "0"s in the array, which could correspond to digitally encoded music, images, software, etc.

SUMMARY

One embodiment relates to an integrated circuit that includes a memory array of pillars arranged in rows and columns. The pillars are separated from one another by row trenches and column trenches. The column trenches include a pair of parallel column trenches. A first trench of the pair includes two parallel bit lines coupled to pillars adjacent to the first trench. A second trench of the pair is free of bit lines.

Other methods, devices, and systems are also disclosed.

BRIEF DESCRIPTION OF THE DRAWINGS

FIGS. 2-4 show perspective drawings of various embodiments of memory cells that include a body region contact;

DETAILED DESCRIPTION

Figure 1:
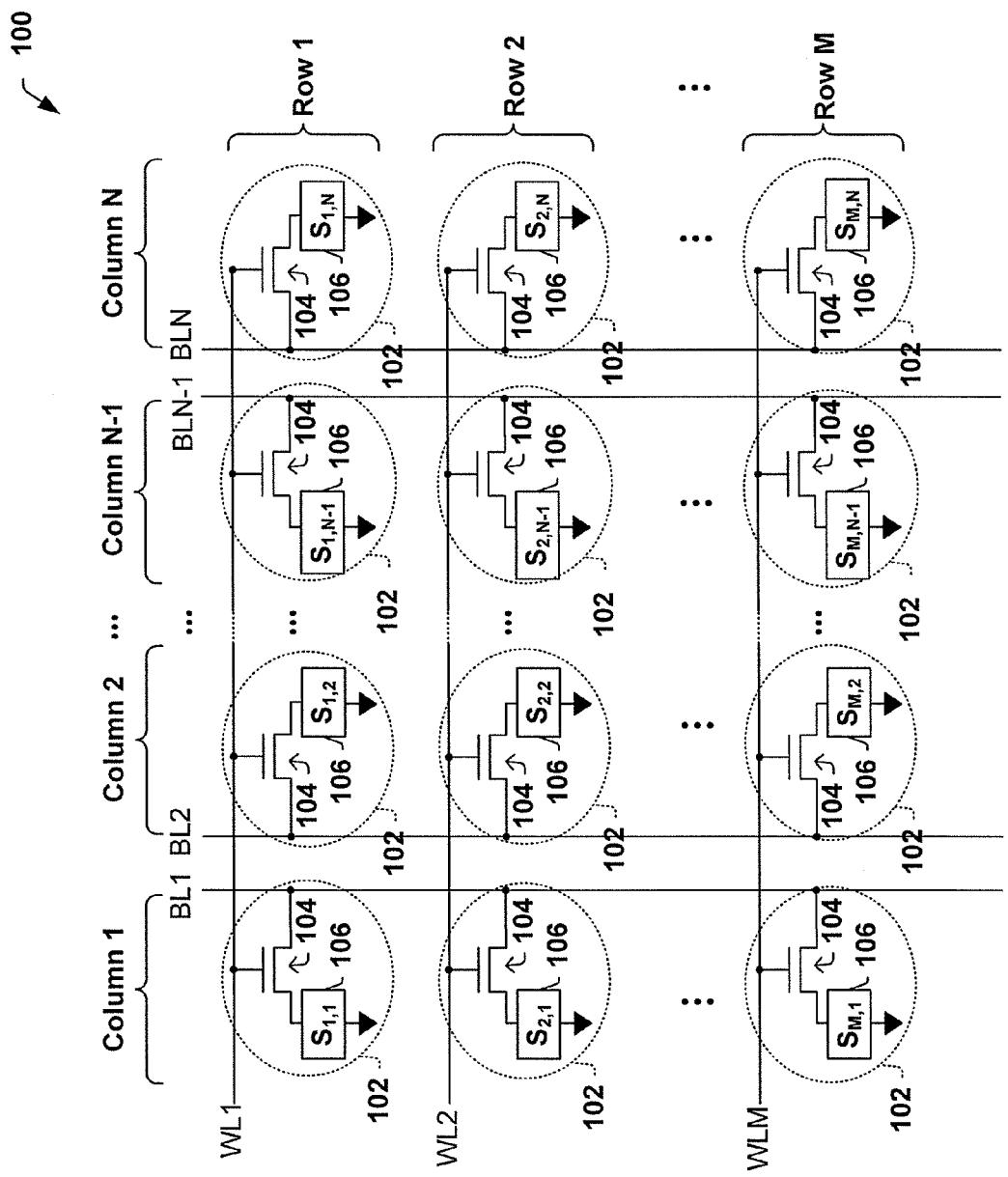
FIG. 1 shows a schematic depiction of a memory array.

One or more implementations of the present invention will now be described with reference to the attached drawings, wherein like reference numerals are used to refer to like elements throughout. The drawings are not necessarily drawn to scale. Nothing in this detailed description is admitted as prior art.

FIG. 1 depicts a memory array 100 that includes a number of memory cells 102. Each memory cell 102 includes an access transistor 104 and a data storage element 106 (indicated as $S_{Row-Column}$), where the storage element 106 is capable of storing one or more bits of data. The memory cells 102 are arranged in M rows (e.g., words) and N columns (e.g., bits). Thus, each row of cells is an N-bit data word accessible by activation of a wordline WL associated with that row. For example, in Row-1 of the array 100, the storage elements $S_{1,1}$ through $S_{1,N}$ form an N bit data word that may be accessible by activation of wordline WL1. Data values can be written to and read from the accessed row of cells using bitlines BL1 through BLN.

In some embodiments of the present invention, the memory cells 102 may be associated with respective semiconductor pillars, where each memory storage element 106 sits atop a respective semiconductor pillar. To facilitate the desired functionality, each pillar includes upper and lower source/drain regions, and a body region vertically disposed between these source/drain regions. Until now, it has been difficult to establish a sufficient electrical contact to the body region. Therefore, some embodiments relate to a body region contact that electrically connects to the body region. Additionally, in some embodiments, adjacent bitlines (e.g., BL1 and BL2) may be formed in a single trench between rows or columns of adjacent pillars. These features may be advantageous in helping to provide an extremely dense layout, thereby providing users with large amounts of data storage in a small, low-cost integrated circuit.

Referring now to FIG. 2, one can see an illustrative memory cell 200 in accordance with some aspects of the present invention. The memory cell 200 includes a semiconductor pillar 202 with a storage capacitor 204 disposed atop of it. The pillar 202 comprises a lower source/drain region 206 having a first conductivity type (e.g., n-type), a body region 208 having a second conductivity type (e.g., p-type), and an upper source/drain region 210 having the first conductivity type (e.g., n-type).

To selectively couple the lower source/drain region 206 to the upper source/drain region 210 (and bottom plate of the storage capacitor 204), a single wordline 212A may run alongside the body region 208, or a split wordline comprising first and second wordline segments 212A, 212B may run alongside opposing sides of the body region 208. A dielectric layer 214 electrically isolates the wordline from the body region 208. When asserted, the wordline induces a charged channel in the body region 208, and/or can cause full depletion of the body region. This channel couples the upper and lower source/drain regions 210, 206, respectively, to one another.

A metal body 216, which may constitute a buried bitline BL, runs alongside the semiconductor pillar 202 and vertically corresponds to the lower source/drain region 206. A dielectric 224 isolates the metal body 216 from the substrate 220. When the wordline is asserted, a write operation can be performed by biasing the metal body 216, causing a predetermined charge to be put on the storage capacitor 204. Alternatively, when the wordline is asserted, a read operation can be performed by floating the metal body 216, and then sensing the charge that leaks off of the storage capacitor 204 onto the bitline.

While the basic functionality of the memory cell 200 is straightforward, it has heretofore been relatively difficult to bias the body region 208. As shown in several embodiments herein, the inventors have fashioned body region contacts to provide such a body bias. In many embodiments, a body region contact may be associated with a side of the pillar opposite the metal body 216.

In FIG. 2's embodiment, for example, the body region contact 218 comprises a region having the second conductivity (e.g., p-type). The body region contact 218 extends downward in the pillar 202 from the body region 208 to the substrate 220 under the pillar 202. This body region contact 218 could be formed, for example, by an angled implant or by out-diffusion of a dopant into the pillar 202. Typically, the body region contact 218 is coupled to a well (e.g., p-well) in the substrate 220. An isolation region 222 may abut the body region contact 218 in some embodiments.

FIG. 3 shows another embodiment of a memory cell 300 where an isolation region 302 abuts the side of the pillar opposite the metal body 216. The body region contact 304 extends vertically from the substrate 220 before extending horizontally to connect to the body region 208 of the memory cell 300. Thus, the body region contact 304 couples the body region 208 to the substrate 220, but still remains isolated from the lower source/drain region 206 due to the isolation region 302. In such embodiments, the body region contact 304 may have an "inverted L-shape", "T-shape", or similar geometry and can comprise any conductive material (e.g., polysilicon or metal).

FIG. 4 shows still another embodiment of a memory cell 350 where a conductive material 352 (e.g., p-type polysilicon) abuts the side of the pillar opposite the metal body 216. In this instance, the body region contact 352 is formed in a trench adjacent to the pillar 202, and no isolation region is present between the pillar 202 and the body region contact 352.

Figure 5:
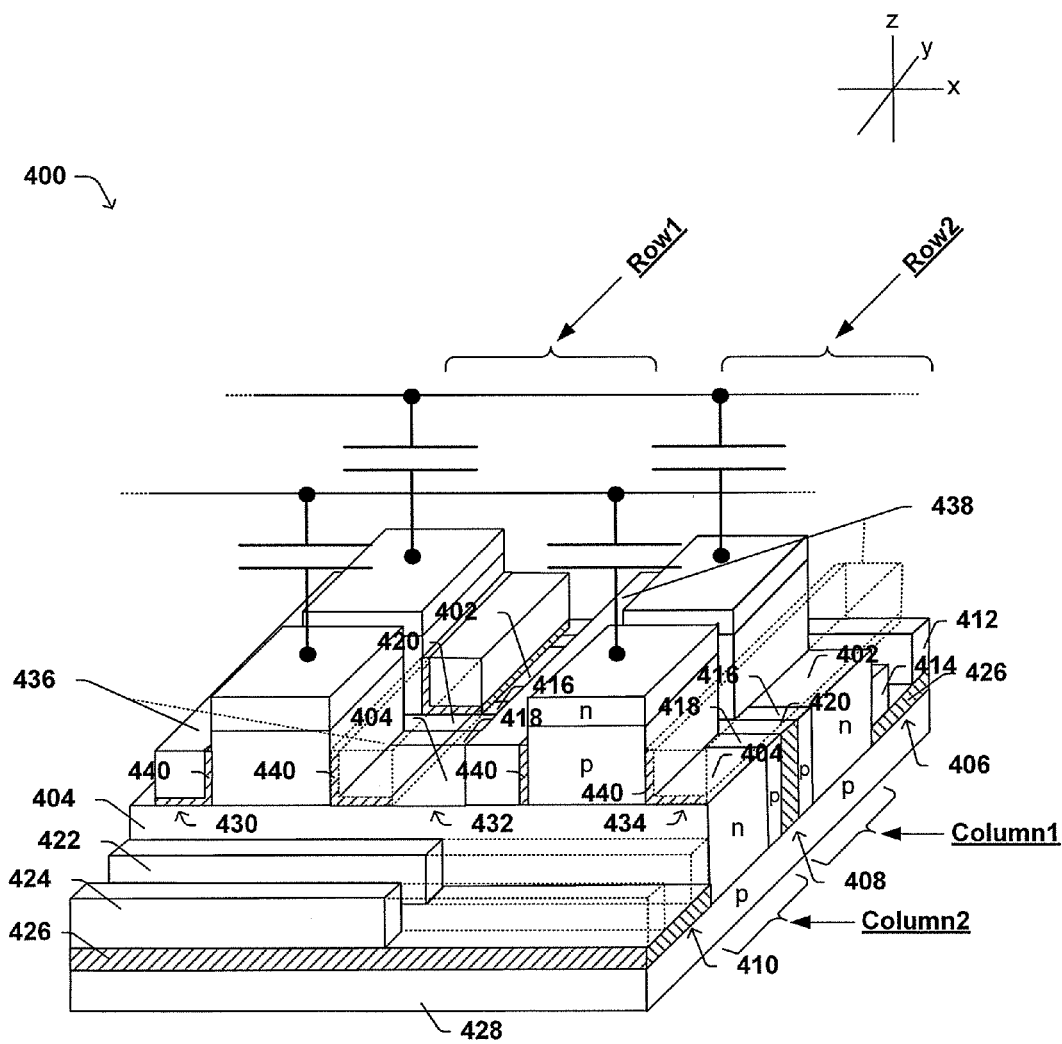
FIG. 5 shows a perspective drawing of a memory array that includes two rows and two columns of memory cells.

FIG. 5 illustrates one manner in which these memory cells may be tiled together to form a memory array 400 with rows and columns. For purposes of clarity and succinctness, this array 400 includes only two rows of pillars (i.e., Row1 and Row2) and two columns of pillars (i.e., Column1 and Column2), although in general arrays may be extended to include any number of rows and columns. In addition, although FIG. 5's embodiment shows body region contacts 416, 418 that comprise doped regions about opposing sides of an isolation region 420 (see e.g., FIG. 2), other body region contacts could also be used (see e.g., FIG. 3, FIG. 4).

In FIG. 5's embodiment, adjacent columns are separated from one another by respective column trenches, where each column includes a continuous lower source/drain region that extends along the length of the entire column. For example, Column1 includes continuous lower source/drain region 402, and Column2 includes continuous lower source/drain region 404. A first column trench 406 separates Column1 from Column0 (not shown). A second column trench 408 separates Column1 from Column2. A third column trench 410 separates Column2 from Column3 (not shown).

Bitlines and body region contacts are disposed in adjacent column trenches in alternating fashion. For example, the first column trench 406 includes a first pair of bitlines 412, 414, where bitline 412 is coupled to the lower source/drain region of Column0 (not shown) and bitline 414 is coupled to the lower source/drain region 402 of Column1. The second column trench 408 is associated with a first pair of body region contacts 416, 418 that extend continuously along sidewalls of second trench 408. An isolation region 420 is also formed between the body region contacts 416, 418. The third trench 410 includes a second pair of bitlines 422, 424, where bitline 422 is coupled to the lower source/drain region 404 of Column2, and bitline 424 is coupled to lower source/drain region of Column3 (not shown). A dielectric layer 426 electrically isolates the bitlines from the underlying semiconductor substrate 428.

Looking now along the rows of FIG. 5, one can see that adjacent rows of pillars are separated from one another by respective row trenches, where the row trenches are at least substantially perpendicular to the column trenches. Thus, first row trench 430 separates Row0 (not shown) from Row 1, second row trench 432 separates Row1 from Row2, and third row trench 434 separates Row2 from Row3 (not shown). At least one wordline is disposed within each row trench. In the illustrated embodiment, split wordlines 436, 438 are disposed along opposing sides of the body regions in Row1, Row2, respectively. In other embodiments, a single wordline could also be disposed along one side of each row of pillars. Dielectric layer 440 separates the split wordlines 436, 438 from the body regions.

Figure 6:
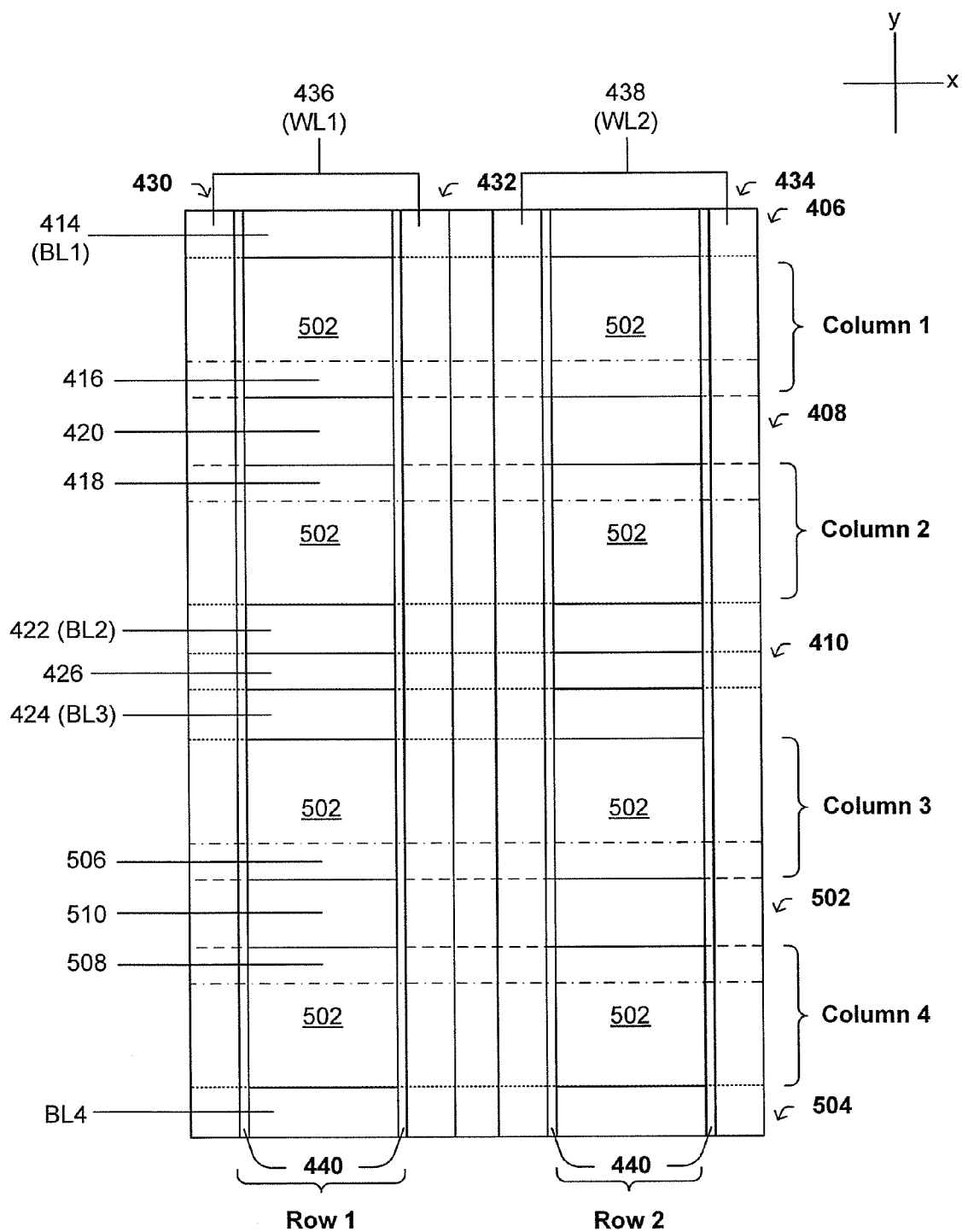
FIG. 6 shows a top view of FIG. 5's embodiment as extended to a memory array that includes two rows and four columns.

FIG. 6 shows a top-level view of the array 400, but has been extended to include eight pillars 502 arranged in two rows and four columns. As shown, the split-wordlines 436, 438 (WL1, WL2) run alongside opposing sides of the pillars of Row1, Row 2, respectively. A dielectric layer 440 electrically separates each wordline from the pillars 502.

Along the columns, bitlines (BL1; BL2 and BL3; BL4) are formed in column trenches (406; 410; 504; respectively) and body region contacts (416 and 418; and 506 and 508) are formed in column trenches (408; 502; respectively). Body region contacts 416, 418 in column trench 408 are separated from one another by isolation region 420, while body region contacts 506, 508 in column trench 502 are separated from one another by isolation region 510.

Figure 7A:
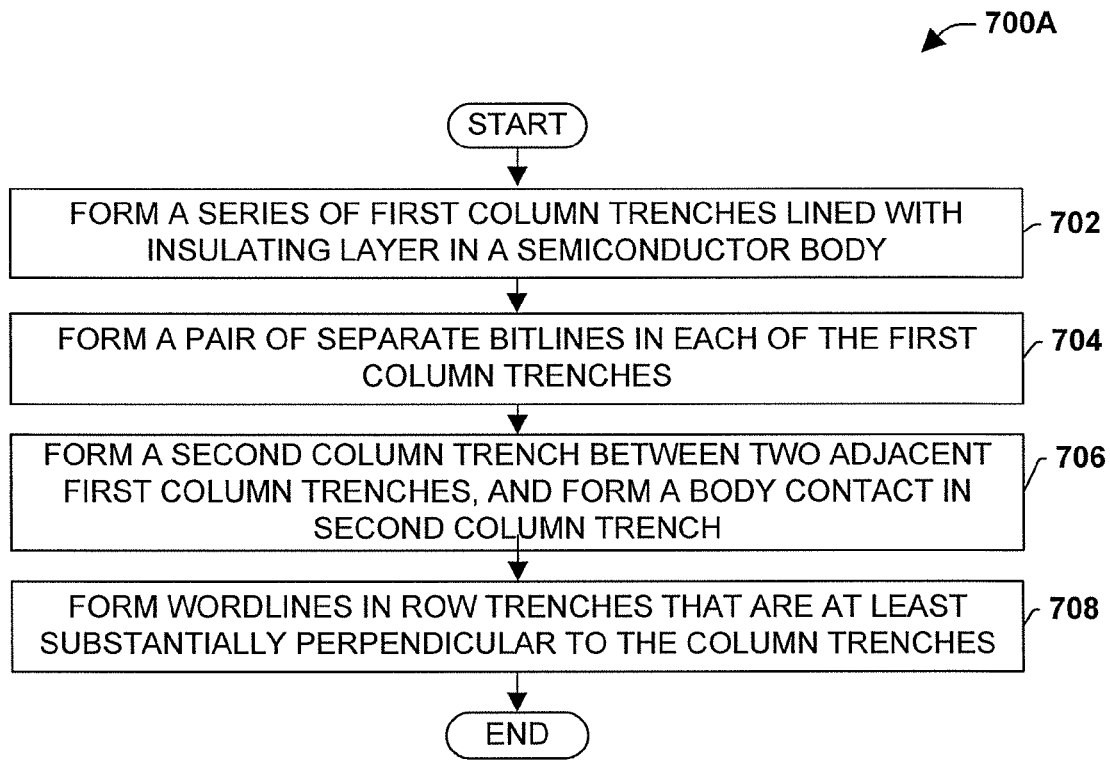
FIG. 7A-7B show flowcharts for manufacturing flows in accordance with some embodiments.
Figure 7B:
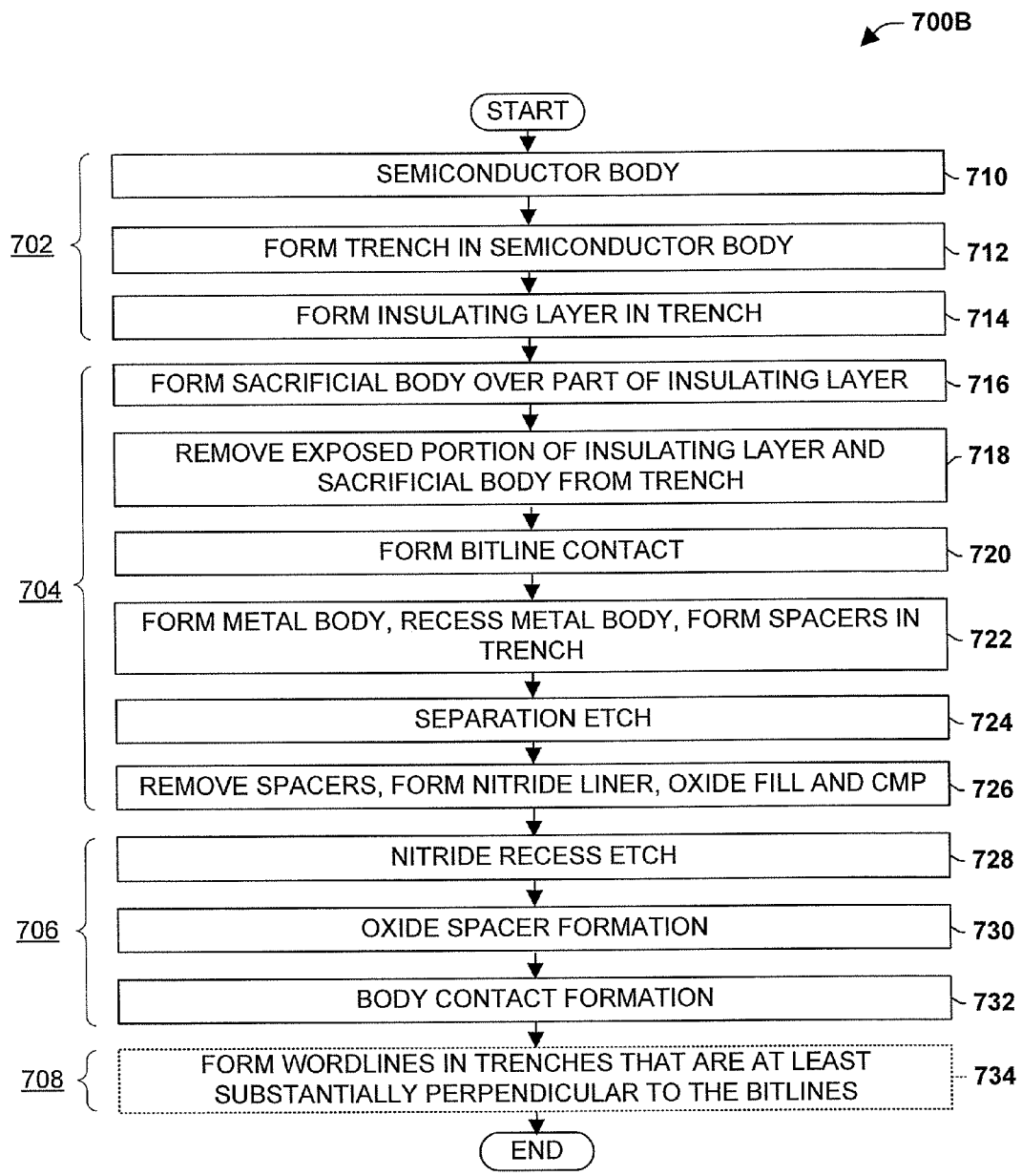

Now that some illustrative structural and functional features have been illustrated and described, reference is made to FIGS. 7A-7B, which show flow diagrams of methods 700A, 700B for manufacturing memory devices. FIG. 7A shows a somewhat general method 700A, while FIG. 7B shows a specific example 700B of how FIG. 7A could be implemented. FIGS. 8-28 show a series of cross sectional views at various stages of manufacture of FIG. 7B's method 700B. Although these cross-sectional views show one example of a manufacturing method, there are also other manufacturing methods that fall within the scope of the present invention. While these methods 700A, 700B are illustrated as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Figure 8:
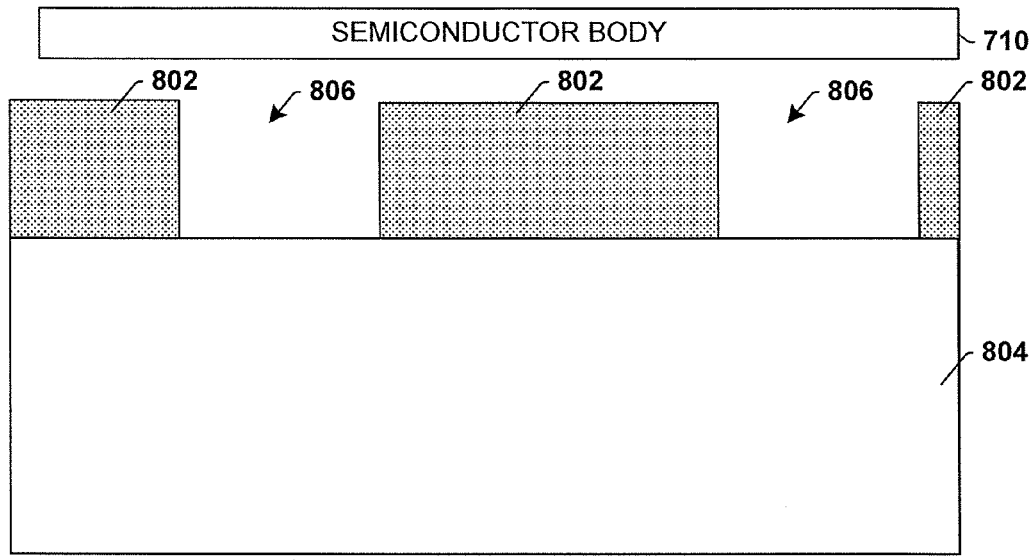
FIGS. 8 through 28 show cross sectional views at various manufacturing stages consistent with FIG. 7B's embodiment.

Turning now to the cross-sections, in FIG. 8, a semiconductor body 804 is provided. The semiconductor body 804 may comprise a simple Si substrate or any other type of semiconductor body, which may include non-semiconductor materials (e.g., oxide in silicon on insulator (SOI), partial SOI substrate, polysilicon, amorphous silicon, organic materials). Thus, the semiconductor body 804 may include semiconductor/non-semiconductor and/or deposited or grown (e.g. epitaxial) layers formed on a semiconductor substrate and/or otherwise associated therewith. A hardmask 802, such as a nitride hardmask, is formed over the semiconductor body 804, and lithography has been used to form openings 806 in the hardmask 802.

Figure 9:
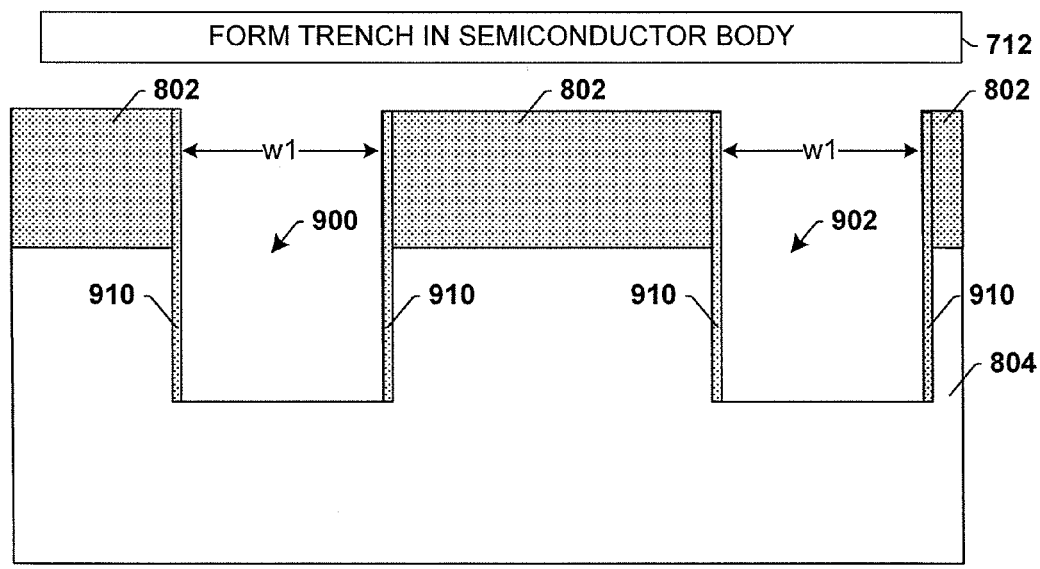

In FIG. 9, first and second bitline trenches 900, 902 have been formed in the semiconductor body 804. Protective spacers 910, such as nitride spacers, are formed on the trenches' sidewalls as shown. In some embodiments the trenches 900, 902 may be formed by reactive ion etching (RIE). In these and other embodiments, the trenches may have widths $w_1$ ranging from approximately 30 nm (for a 20 nm node $4F^2$) to approximately 60 nm (for a 40 nm node $4F^2$).

Figure 10:
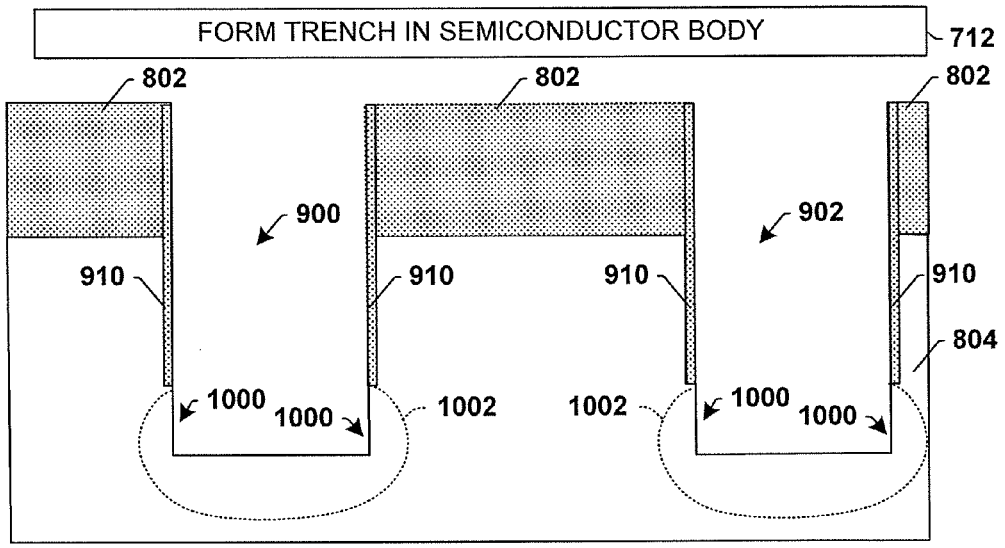

In FIG. 10, the depth of the trench is increased to create unprotected sidewalls 1000 in the trench. In one embodiment, this can be done by RIE. In some embodiments, an isotropic etch can be used to isotropically widen the substrate, creating a recessed surface 1002 in the lower region of the trench. A pair of metal bodies can later be formed on opposing sides of the recessed surface, where the metal bodies act as bitlines. The recessed surface 1002 allows the bitlines to be formed further apart from one another within the trench (compared to a rectangular trench configuration), thereby reducing coupling between the bitlines and improving performance.

Figure 11:
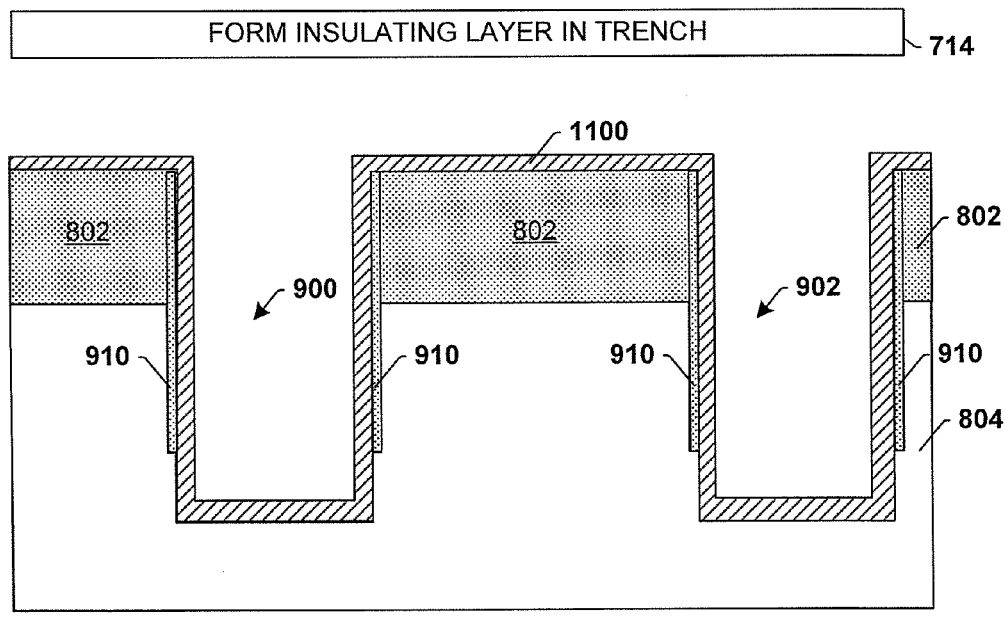

In FIG. 11, an insulating layer 1100 is conformally formed in the trenches 900, 902. In some embodiments, this insulating layer 1100 is an oxide layer formed by a deposition process.

Figure 12:
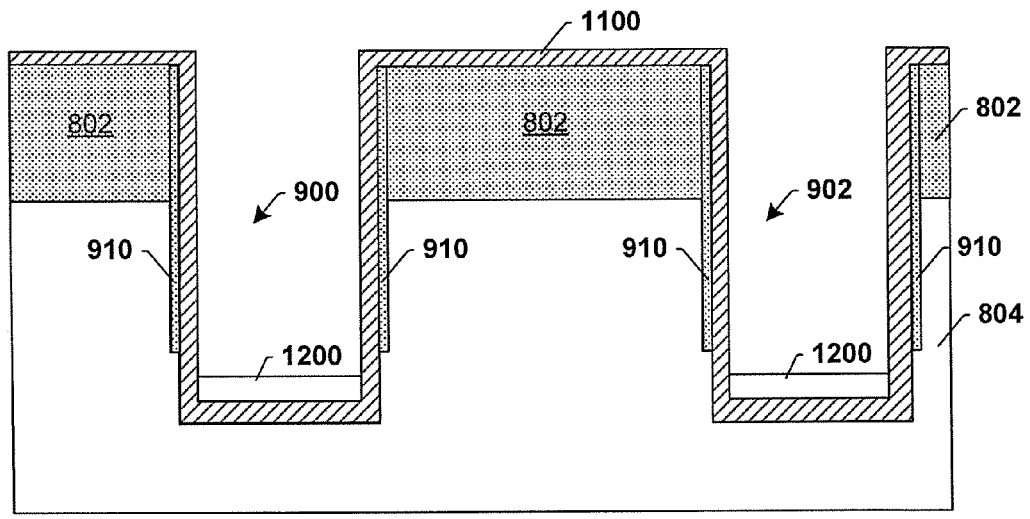

In FIG. 12, sacrificial layer 1200 is formed in the bottom of the trenches 900, 902. For example, in one embodiment sacrificial polysilicon is used to fill the trench, after which the sacrificial polysilicon is recessed to form the sacrificial layer 1200.

Figure 13:
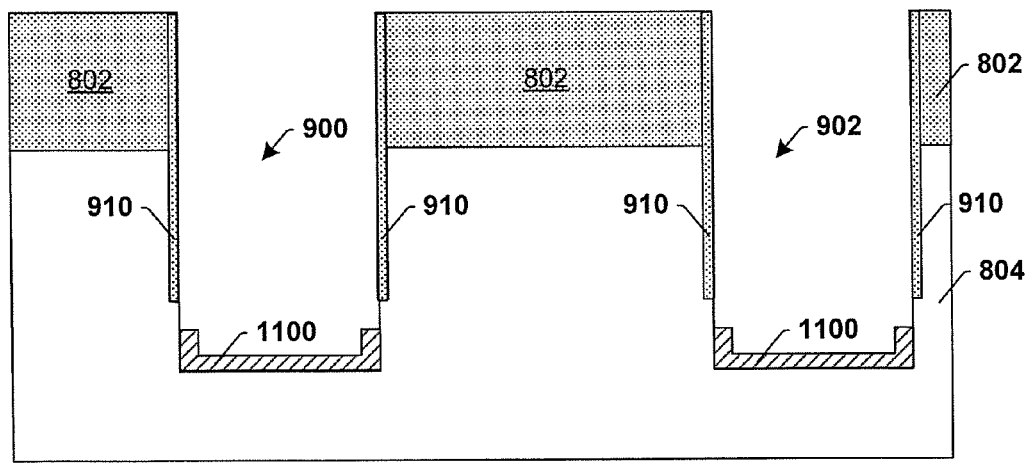

In FIG. 13, the exposed portions of the insulating layer 1100 and are removed, after which the sacrificial layer 1200 is also removed.

Figure 14:
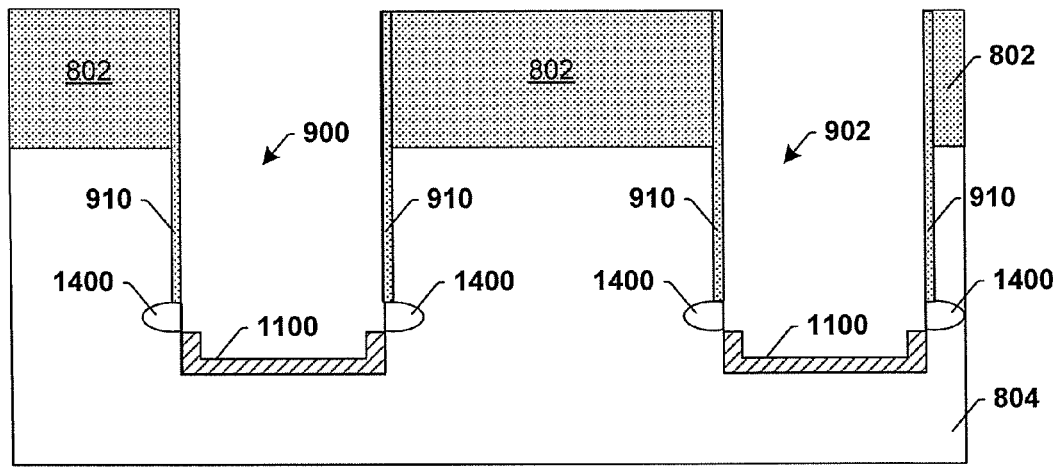

In FIG. 14, bitline contacts 1400 are formed between the protective spacers 910 and the remaining insulating layer 1100. In one embodiment, the bitline contacts 1400 are formed by depositing a doped liner (not shown) and then out-diffusing the dopants from the doped liner. In another embodiment, the bitline contacts 1400 can be formed by performing an angled implant. In still another embodiment, the bitline contacts 1400 can be formed in the initial semiconductor substrate (see e.g., FIG. 8) by use of a deep implant.

Figure 15:
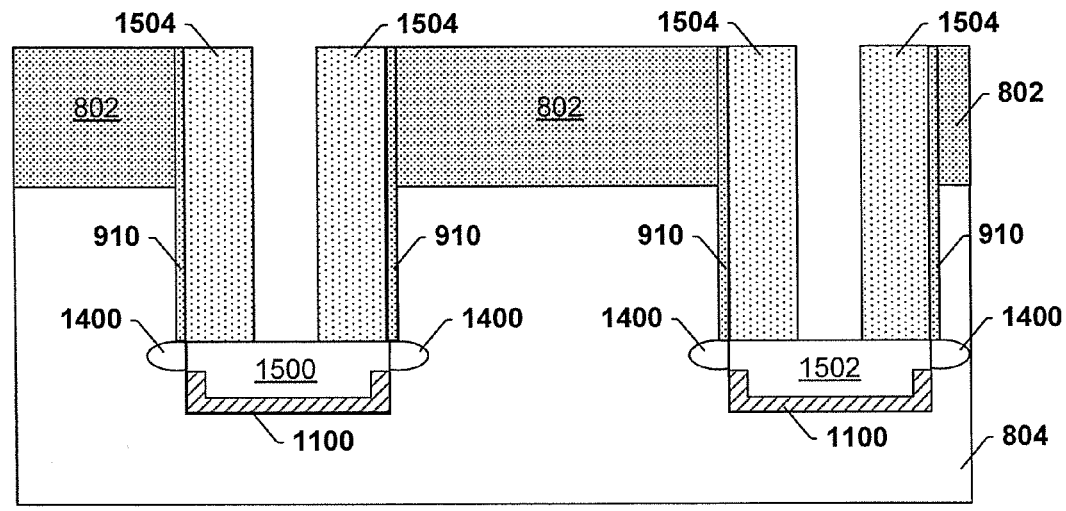

In FIG. 15, first and second metal bodies 1500, 1502 (e.g., bitlines) fill the trenches 900, 902, respectively. The metal bodies 1500, 1502 are then recessed to be disposed substantially in the bottom of the trenches 900, 902. Next, spacers 1504 are formed on the sidewalls of the trenches. In some embodiments, the material of the metal bodies 1500, 1502 could comprise W, Ti, TiN, or other Ti-based materials. The metal bodies 1500, 1502 could also comprise multiple sublayers of different compositions.

Figure 16:
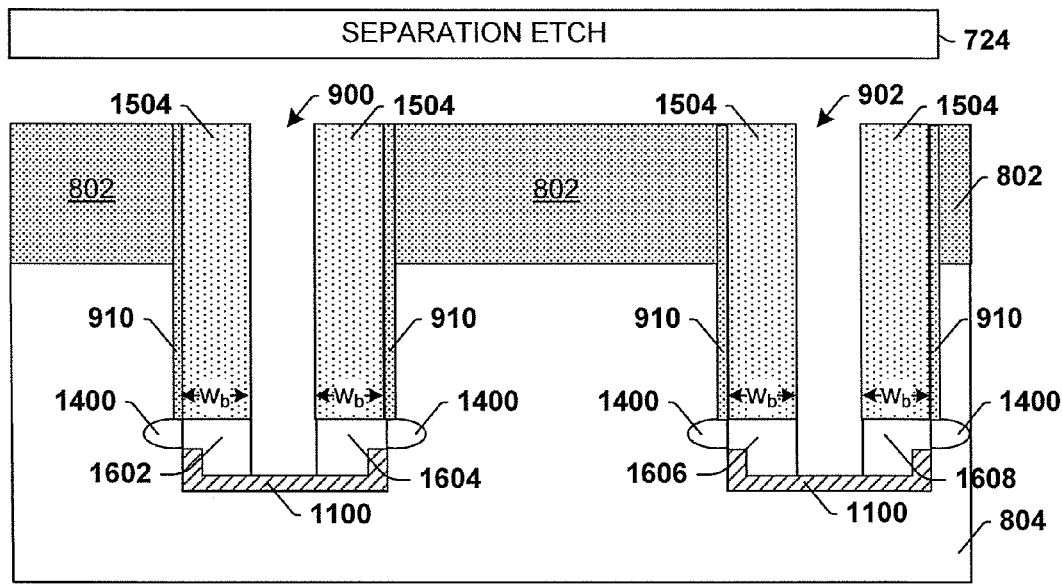

In FIG. 16, a selective etch is used to selectively remove the exposed portions of the metal bodies 1502, 1504. In this manner, two separate metal bitlines can be formed in the bottom of a single trench. More particularly, the first trench 900 now includes separately assertable metal bitlines 1602, 1604, and the second trench 902 includes separately assertable metal bitlines 1606, 1608. Because of the process employed, these bitlines may have widths, $w_b$, that are smaller than the smallest feature size resolvable by lithography alone.

Figure 17:

In FIG. 17, the spacers 1504 are removed, after which a liner 1700 is formed. In one embodiment, the liner 1700 is a nitride liner. Next, a dielectric 1702, such as oxide, is used to fill the remainder of the trenches. Chemical mechanical polishing (CMP) is then used to planarize the top surface of the structure.

Figure 18:
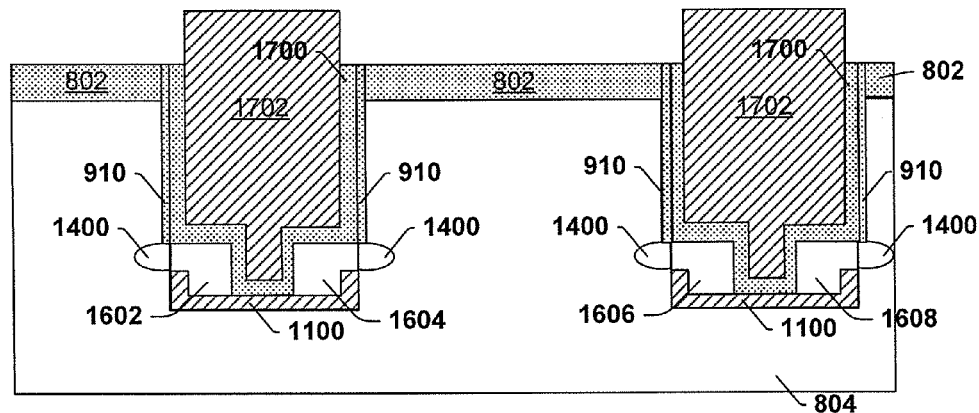

In FIG. 18, an etch is performed to remove exposed portions of the nitride layer 802, thereby recessing the nitride layer 802.

Figure 19:
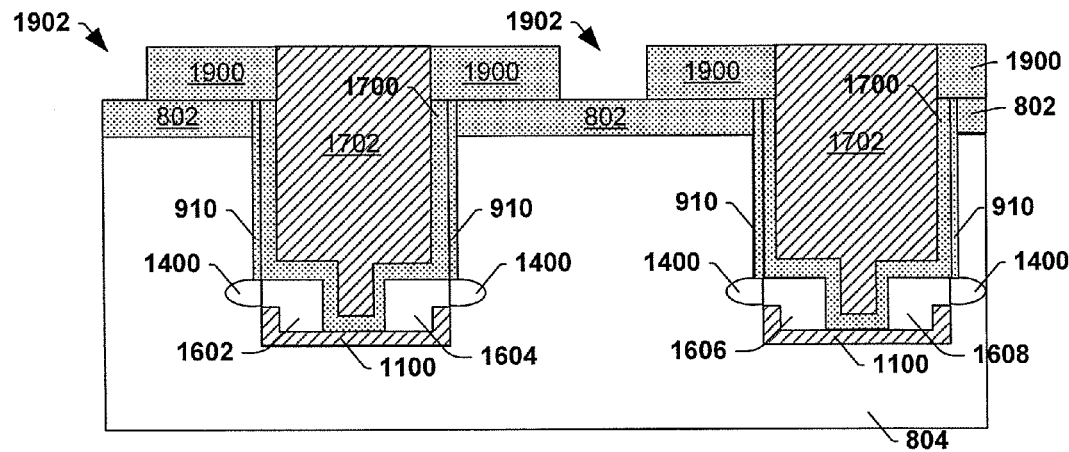

In FIG. 19, an oxide spacer 1900 is formed and etched, where the thickness of the spacer defines the width of the opening 1902 (and hence, the width of the adjacent pillars). The opening 1902 is self-aligned in the middle (between) the bitline cap dielectrics 1702. This self-aligned process is useful in that it saves a mask for the process flow as well as the processing associated therewith, thereby saving costs when compared to non-self aligned embodiments in which a separate mask is used to pattern an opening between the bitline cap dielectrics 1702. The self aligned process also ensures the opening 1902 is equidistant between the cap dielectrics 1702, while the non-self-aligned process may possibly result in the opening 1902 being off-center.

As shown in FIGS. 20-30, at some point in the manufacturing flow, an upper source/drain region 1904 having a first conductivity type is formed. A body region 1906 having a second conductivity type is also formed, as is a lower source/drain region 1908 having the first conductivity type. Although the doped regions are shown as being formed after the formation of the first and second trenches, the doped regions could also be formed on the original semiconductor body or at other times. For example, the doped regions could be formed (similar to well regions) in the original semiconductor body of FIG. 8. The body region contacts 1400 could also be formed by doping, rather than by out-diffusion as mentioned above, and could also be formed at any stage during processing. As now discussed below, one of several different embodiments can be used to form body region contacts to the body regions 1906. More particularly, four embodiments are discussed below where the body region contacts operably couple body regions 1906 to the substrate 804.

Figure 20:
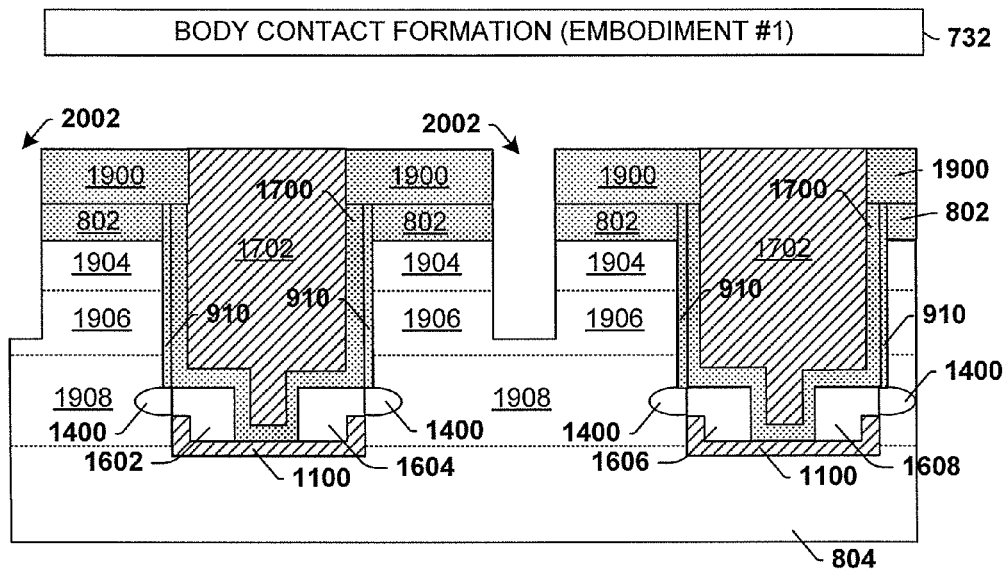

FIGS. 20-23 show a first embodiment for making a body region contact. In FIG. 20, the exposed portion of the nitride layer is removed to form other trenches 2002 that extend downward into the semiconductor body 804. In this embodiment, the trench 2002 extends down to vertically correspond to the body region 1906. Although an anisotropic (vertical) etch is shown, in other embodiments a selective anisotropic etch can be used to remove the nitride layer 802, followed by formation of spacers along the sidewalls of the trench, and subsequently followed by another etch into the semiconductor body.

Figure 21:
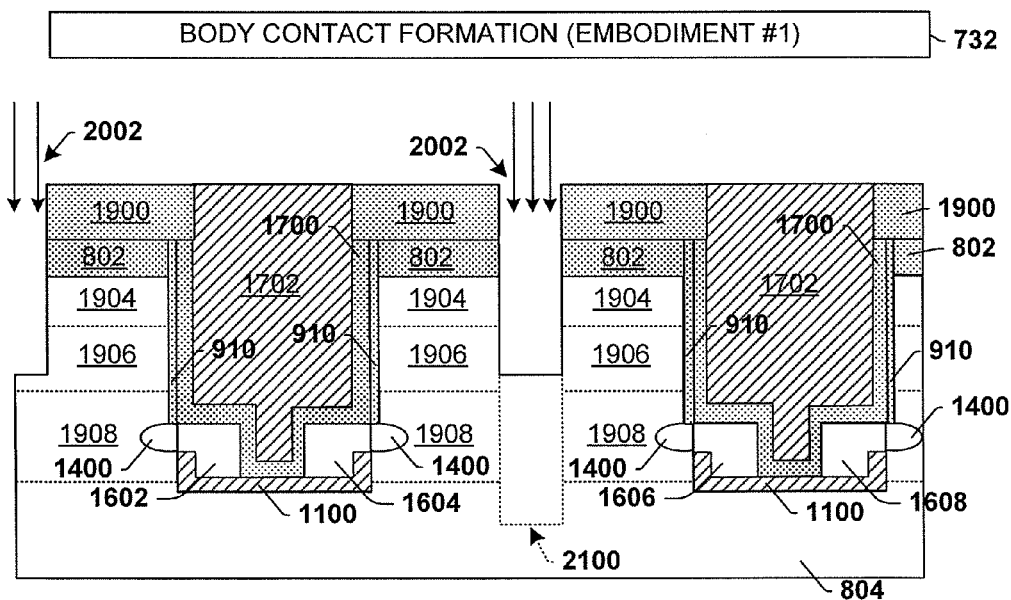

In FIG. 21, an implantation is carried out to dope body region contacts 2100 to the same doping type as the body region 1906 and the substrate/well 804. The body region contacts 2100 extend vertically downward from the body region 1906 to the semiconductor body 804 under the lower source/drain region 1908.

Figure 22:
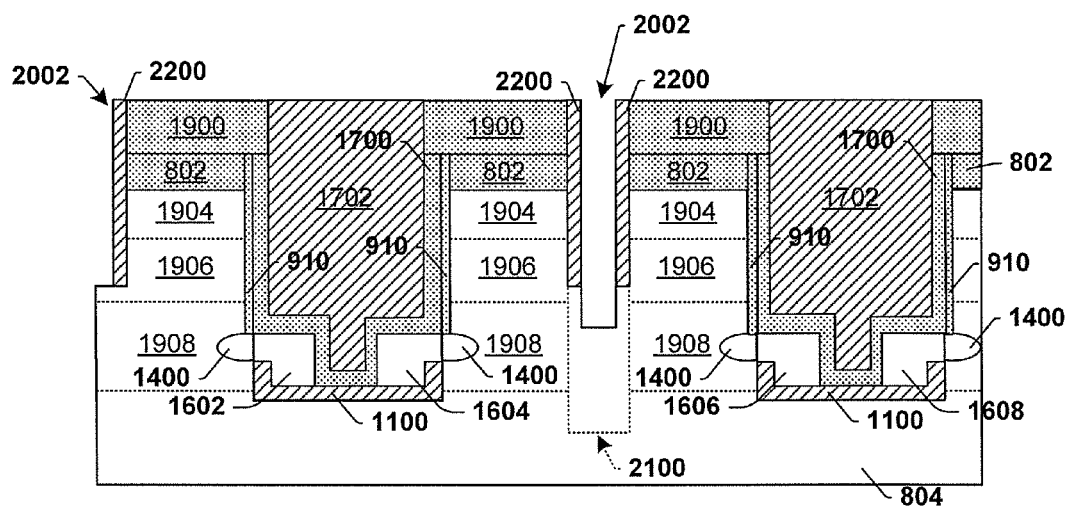

In FIG. 22, spacers 2200 are formed on the sidewalls of the trenches 2002. These spacers 2200 may help to isolate the body region contact 2100 from the wordlines. The spacers 2200 could comprise Silicon dioxide ($SiO_2$), spin-on-dielectric, or other types of dielectric. While the spacers 2200 are in place, an etch is performed to make the trenches 2002 deeper in a central region of the body region contacts 2100.

Figure 23:
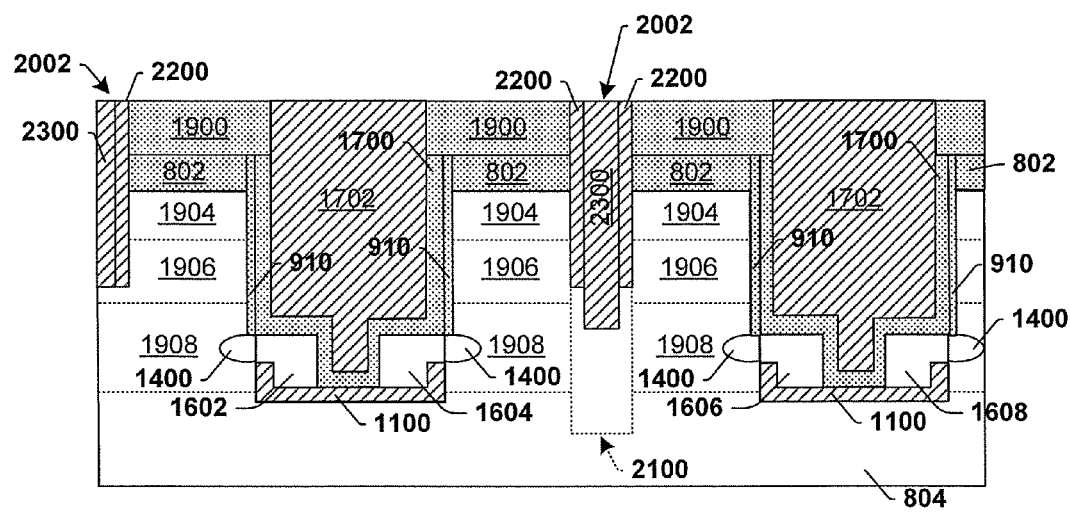

In FIG. 23, a dielectric layer 2300 is formed to fill the remainder of the trenches 2002. Thus, a body region contact 2100 is formed, whereby the body region contact 2100 operably couples body regions 1906 on opposing sides of a single trench to a substrate/well 804.

Figure 24:
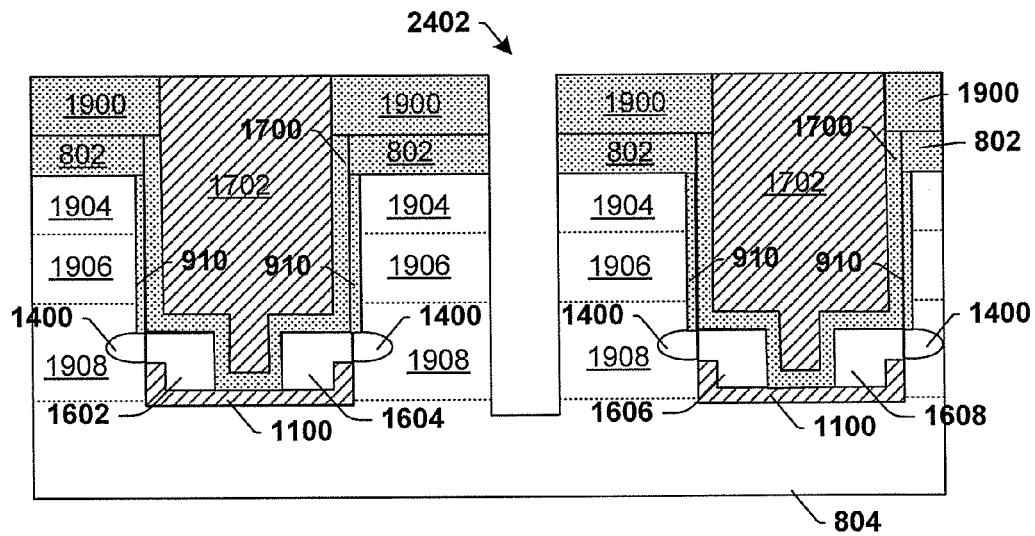
Figure 25:
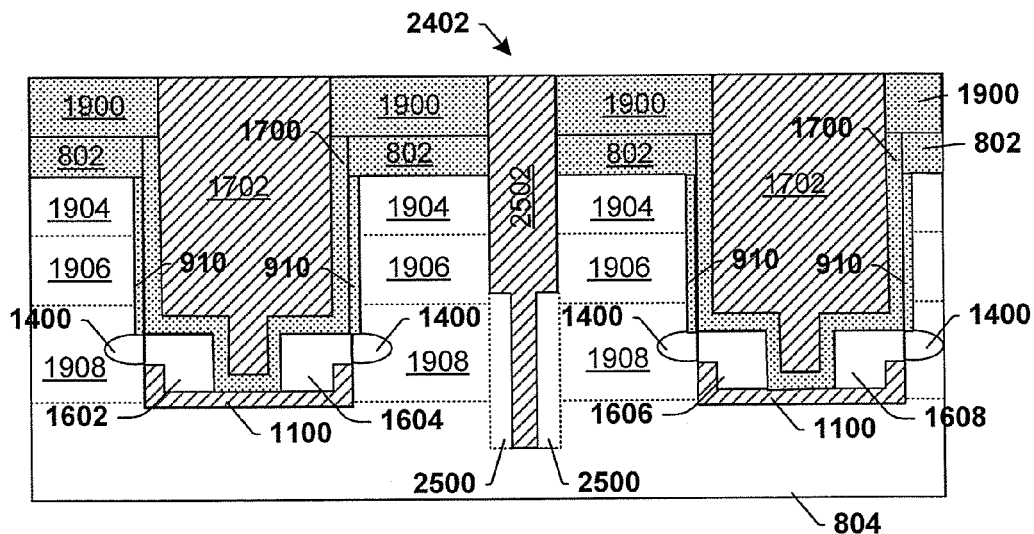

Referring now to FIGS. 24-25, one can see a second embodiment for forming body region contacts (stemming from FIG. 19). In FIG. 24, the exposed portion of the nitride layer 802 is removed to form other trenches 2402 that extend downward into the semiconductor body 804. In this embodiment, the trench 2402 extends down to just past the lower source/drain region 1908.

In FIG. 25, p-type body contacts 2500 are formed on opposing sidewalls of the trench 2402. These body contacts 2500 could be formed by depositing a p-type material, then recessing the p-type material, forming spacers on the sidewalls of the trench, and then etching away the portion of the p-type material not covered by the spacers. In any event, a dielectric layer 2504 is then formed to fill the remainder of the trench 2402. Another possibility is to deposit a liner of p-type material and recess it. This other possibility leads to a structure similar to FIG. 25, except that the body contact 2500 will continuously fill the bottom of the trench (i.e., will not be divided into two separate body contacts at the bottom of the trench.)

Figure 26:
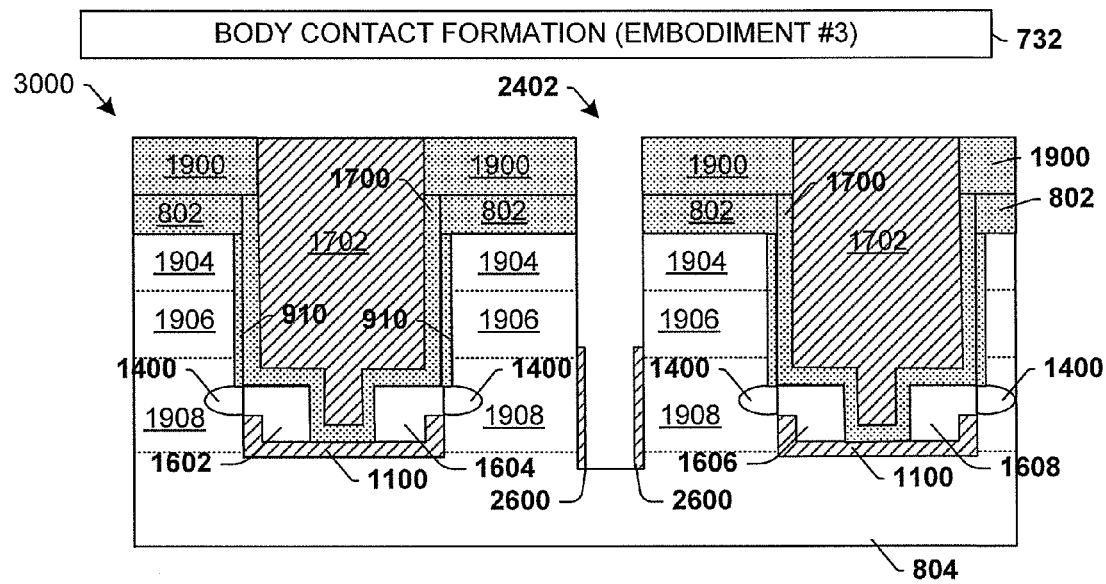
Figure 27:
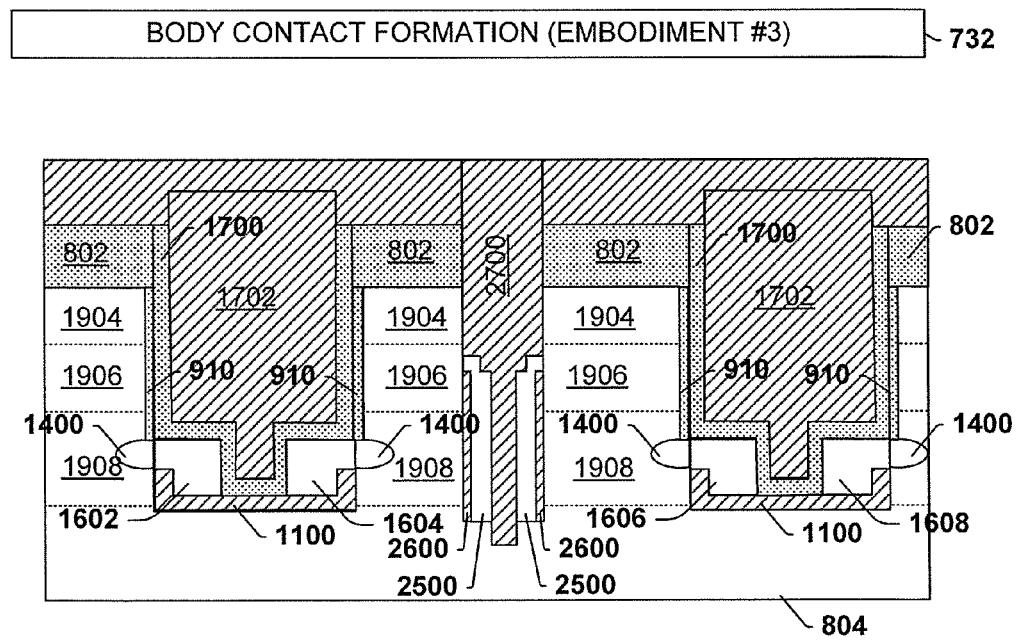

FIGS. 26-27 show a third embodiment for forming body region contacts. In FIG. 26 of this third embodiment, dielectric spacers 2600 are formed on the sidewalls of the trench 2402. In FIG. 27, the trench 2402 can be filled with p-type material, which is then recessed. An additional spacer (e.g., oxide spacer—not shown) can then be formed, after which an etch (e.g., dry etch such as RIE) can be carried out to separate the p-type material into vertical portions of body region contacts 2500. A dielectric 2700, such as oxide, can then fill the remainder of the trench. Alternatively, a p-type liner can be deposited, and can then be recessed to form 1906, after which the dielectric can fill the trench.

Figure 28:
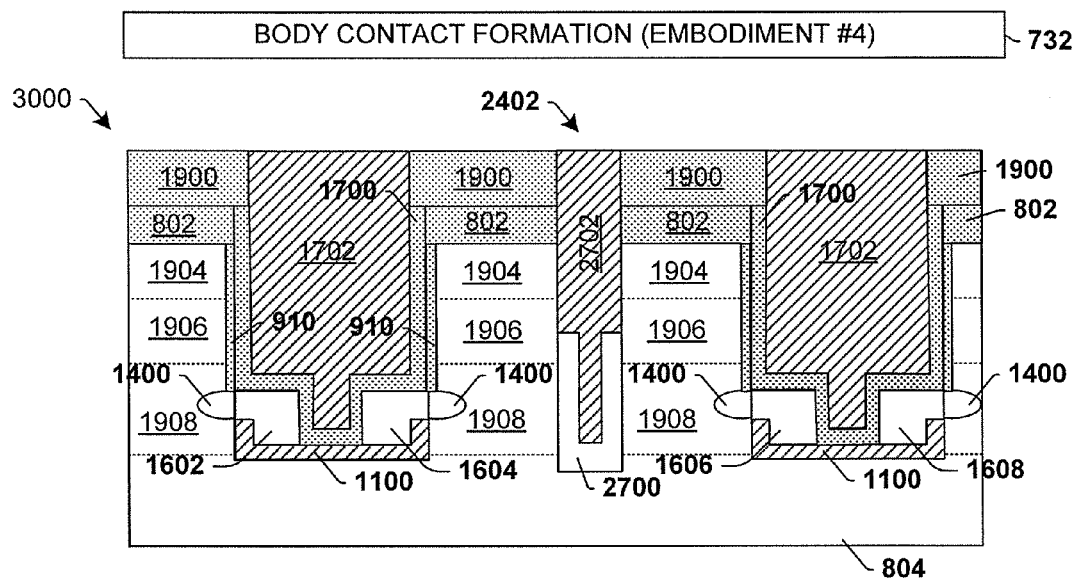

FIG. 28 shows a fourth embodiment for forming body region contacts. In this embodiment a u-shaped body region contact 2700 is formed in the bottom of the trenches. This u-shaped body region contact 2700 often has the same conductivity type as the body region 1906 and substrate/well 804 (i.e., opposite conductivity of the lower source/drain region 1908). This U-shaped body region contact 2700 is coupled to the body regions 1906 both sides of the trenches. A dielectric 2702 is formed over the u-shaped body region contact 2700.

Figure 29:
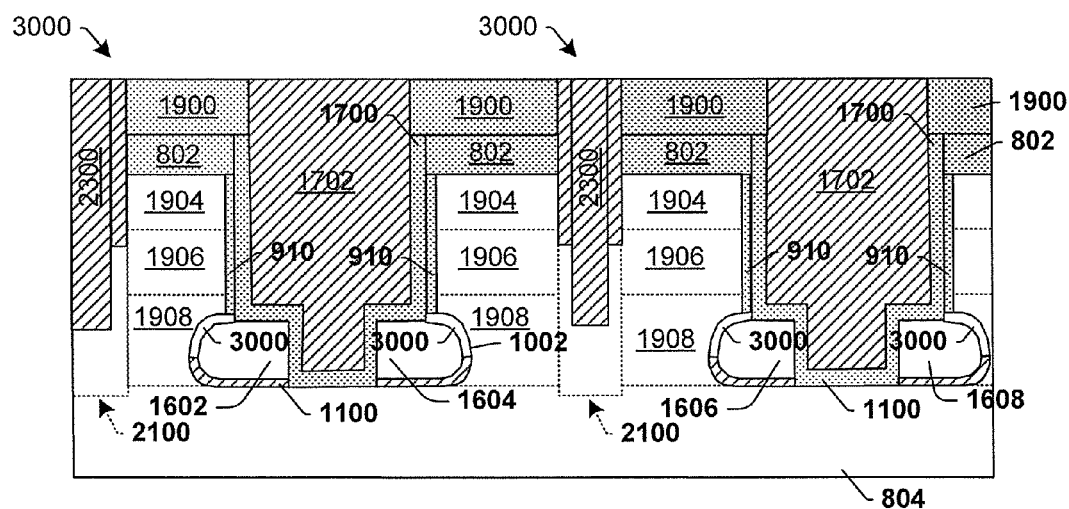
FIG. 29 shows a cross sectional view of another embodiment.

FIG. 29 shows another embodiment that includes a recessed surface 1002 (e.g., formed by an isotropic etched as mentioned with respect to FIG. 10). In this example, the metal bodies (1602, 1604, 1606, 1608) act as bitlines and are coupled to the lower source/drain regions 1908 by respective contact regions 3000 that conform to the recessed surface 1002. In some embodiments, these contact regions 3000 comprise Ti—Si, although they could also comprise other materials instead of or in addition to Ti—Si. Again, this isotropic etch enables the bitlines in a trench (e.g., 1602, 1604) to be spaced further laterally apart compared to the rectangular trench embodiments.

While the invention has been illustrated and described with respect to one or more implementations, alterations and/or modifications may be made to the illustrated examples without departing from the spirit and scope of the appended claims. For example, although some embodiments have been illustrated and described above with regard to rectangular or box-shaped features (e.g., pillars, wordlines, bitlines, etc.), these features may have other shapes in other embodiments. For example, the pillars and/or other features may have rounded shapes (including cylindrical, rod-like, u-shaped, or others) within the scope of the present invention. Further, although buried wordlines are shown as being disposed over buried bitlines, in other embodiments these features could be flipped relative to one another (i.e., the buried bitlines could be disposed over the buried wordlines).

In addition, although some memory arrays that include capacitive storage elements have been shown above, other embodiments could include other types of data storage elements including, but not limited to: resistive memory elements, ferroelectric memory elements, or cross-coupled inverters. Depending on the implementation, these data storage elements could be disposed over respective pillars as illustrated, but could also be disposed in other manner relative to the pillars (e.g., below the respective pillars). Other embodiments relate to other integrated circuits and semiconductor devices (not merely memory arrays).

All such variations are contemplated as falling within the scope of the present application. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising"

What is claimed is:

1. An integrated circuit including a memory array, the memory array comprising:
   a semiconductor body including an array of semiconductor pillars that are arranged in a series of rows and columns separated by column trenches and row trenches, wherein the respective semiconductor pillars comprise respective body regions vertically disposed between respective upper source/drain regions and respective lower source/drain regions;
   a first column trench disposed between pillars of a first column and pillars of a second column;
   a pair of parallel bitlines disposed within the first column trench and electrically isolated from one another, a first bitline of the pair coupled to an upper or lower source/drain region of the first column, and a second bitline of the pair coupled to an upper or lower source/drain region of the second column;
   second and third column trenches disposed, relative to the first column trench, on opposite sides of the respective first and second columns of pillars, respectively, wherein no bitlines are disposed in or adjacent to the second and third column trenches; and
   body region contacts disposed in the second and third column trenches and coupled to body regions of pillars in the first and second columns, respectively.

2. The integrated circuit of claim 1, where the first and second bitlines are separate metal bitlines of the memory array pillars.

3. The integrated circuit of claim 1, where the second column trench includes at least one body contact coupled to a body region in at least one pillar adjacent to the second column trench.

4. The integrated circuit of claim 1, wherein:
   the lower source/drain region of the second column comprises a first conductivity type to which the second bitline is coupled;

the upper source/drain regions of the second column comprise the first conductivity type; and the body regions of pillars in the second column comprise a second conductivity type that is opposite the first conductivity type.

5. The integrated circuit of claim 4, where the body region contact has the second conductivity type and extends downward from the body region to a substrate under the lower source/drain region.

6. The integrated circuit of claim 4, where lower source/drain regions extend continuously between pillars along the second column.

7. The integrated circuit of claim 4, further comprising:
a conductive wordline disposed in a row trench traversing the pair of bitlines, the conductive wordline adjacent to the body region of the pillar and separated from the body region by a gate dielectric layer.

8. The integrated circuit of claim 7, where the conductive wordline is arranged over the pair of bitlines.

9. The integrated circuit of claim 1, where the body region contact in the third column trench abuts pillars in the second column and abuts pillars in a third column, the third column adjacent to the second column.

10. The integrated circuit of claim 1, further comprising:
an isolation region abutting the side of the second column of pillars opposite from the first column trench and isolating the body region contact in the third column trench from the lower source/drain region of the second column.

11. The integrated circuit of claim 1, where different pillars of the array have approximately the same height, length and width as one another.

12. The integrated circuit of claim 1, further comprising:
memory storage elements disposed atop respective semiconductor pillars.

* * * * *